(12) United States Patent
Park

(10) Patent No.: US 12,295,246 B2
(45) Date of Patent: May 6, 2025

(54) HEATER FOR THERMAL EVAPORATOR

(71) Applicant: INDUSTRY-UNIVERSITY COOPERATION FOUNDATION SUNMOON UNIVERSITY, Asan-si (KR)

(72) Inventor: Young Wook Park, Asan-si (KR)

(73) Assignee: INDUSTRY-UNIVERSITY COOPERATION FOUNDATION SUNMOON UNIVERSITY, Asan-si (KR)

(*) Notice: Subject to any disclaimer, the term of this patent is extended or adjusted under 35 U.S.C. 154(b) by 524 days.

(21) Appl. No.: 17/723,842

(22) Filed: Apr. 19, 2022

(65) Prior Publication Data

US 2022/0399502 A1 Dec. 15, 2022

(30) Foreign Application Priority Data

Jun. 9, 2021 (KR) .................. 10-2021-0075024

(51) Int. Cl.
  *C23C 14/26* (2006.01)
  *H10K 50/00* (2023.01)
  *H10K 71/18* (2023.01)

(52) U.S. Cl.
  CPC ............. *H10K 71/18* (2023.02); *H10K 50/00* (2023.02)

(58) Field of Classification Search
  CPC ....... C30B 25/08; C30B 29/403; C30B 25/14; C30B 25/165; C23C 16/303; C23C 16/4482; C23C 16/52; C23C 16/4408; C23C 16/45525; C23C 16/4583; C23C 16/448; C23C 16/45544; C23C 16/455; C23C 16/4481; C23C 14/26; C23C 14/12; G01F 23/0007; G01F 23/04; B01J 4/008; B67D 7/3263; B67D 7/0238; H10K 71/18; H10K 50/00; H05B 6/26
  USPC ............... 118/726, 727; 156/345.29, 345.37; 122/21
  See application file for complete search history.

(56) References Cited

U.S. PATENT DOCUMENTS

| | | | |
|---|---|---|---|
| 4,748,315 A * | 5/1988 | Takahashi | C23C 14/26 118/726 |
| 5,034,604 A * | 7/1991 | Streetman | C30B 23/066 392/389 |
| 5,253,266 A * | 10/1993 | Knodle, III | C30B 23/066 118/726 |
| 2006/0096542 A1* | 5/2006 | Ryu | C23C 14/243 118/726 |

* cited by examiner

*Primary Examiner* — Rudy Zervigon
(74) *Attorney, Agent, or Firm* — Bridgeway IP Law Group, PLLC; Sang Ho Lee; Hyun Woo Shin

(57) ABSTRACT

A heater for an evaporator includes a heating wire and a support, and the heating wire includes a tunnel part that surrounds an outer surface of a container in which an organic material is accommodated and is coiled in a cylindrical shape, a flange part that is connected to an upper end of the tunnel part and has a spiral structure in which a radius increases in a plane direction, a first straight part extending downward from a lower end of the tunnel part, and a second straight part extending downward from a distal end of the flange part, and the support includes a ring part that supports a lower surface of the flange part, and a plurality of bars extending downward form the ring part.

7 Claims, 8 Drawing Sheets

HEATER FOR THERMAL EVAPORATOR

CROSS-REFERENCE TO RELATED APPLICATION

This application claims priority to and the benefit of Korean Patent Application No. 10-2021-0075024 filed on Jun. 9, 2021, the disclosure of which is incorporated herein by reference in its entirety.

BACKGROUND

1. Field of the Invention

The present disclosure relates to a heater for a thermal evaporator, and more particularly, to a filament-type heater for a thermal evaporator used for organic material deposition for manufacturing an organic electronic element represented as an organic light emitting diode.

2. Discussion of Related Art

Thermal evaporators are used to deposit thin films included in organic light emitting displays on substrates.

In general, a thermal evaporator includes an evaporation source installed in a vacuum chamber. A substrate on which an organic material in the evaporation source is to be deposited is loaded into the vacuum chamber at a height spaced apart from the evaporation source by a predetermined distance. The thermal evaporator applies power to a heater to heat the organic material of the evaporation source so as to evaporate or sublimate the organic material, thereby depositing the organic material on the substrate. The evaporation source includes a crucible containing an organic material and a heater for heating the crucible.

In general, the heater may be installed in a structure surrounding the cylindrical crucible. The heater may be made of filaments of tantalum (Ta) (Tm: 2850° C.) and tungsten (W) (Tm: 3387° C.) which are materials having excellent thermal stability and efficiency.

A method of heating a crucible using a heater corresponds to an indirect heating method. In addition, there is a direct heating method in which electricity directly passes to the crucible or an electron beam heating method using electron beams. The indirect heating method using a heater is mainly used because deposition control is stable.

However, as heating of the heater continues, the heater may sag downward.

Accordingly, the inventor of the present disclosure has researched for a heater for a thermal evaporator for a long time, has gone through trials and errors, and thus has completed the present disclosure.

SUMMARY OF THE INVENTION

The present disclosure is directed to providing a heater for a thermal evaporator capable of improving a process yield by reducing problems of an existing heater at a low cost.

Meanwhile, other purposes not specified in the present disclosure will be additionally considered within a range that may be easily inferred from the following detailed description and the effects thereof.

According to an aspect of the present disclosure, there is provided a heater for a thermal evaporator, including a heating wire and a support, wherein the heating wire includes a tunnel part that surrounds an outer surface of a container in which an organic material is accommodated and is coiled in a cylindrical shape, a flange part that is connected to an upper end of the tunnel part and has a spiral structure in which a radius increases in a plane direction, a first straight part extending downward from a lower end of the tunnel part, and a second straight part extending downward from a distal end of the flange part, and the support includes a ring part that supports a lower surface of the flange part, and a plurality of bars extending downward form the ring part.

The support may be fixed onto a disk, and the tunnel part of the heating wire may be located above the disk.

The first straight part and the second straight part may further pass through the disk and extend downward, and the first straight part and the second straight part may be surrounded by an insulator, and the insulator is formed to pass through the disk.

The support may be formed of a material including ceramics.

the flange part may be formed perpendicular to the tunnel part.

An upper surface of the ring part of the support may be formed to be flat, and a width of the ring part of the support may be greater than a width of the flange part.

A coil pitch of an upper side of the tunnel part may be smaller than a coil pitch of a lower side thereof.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

Figure 1:
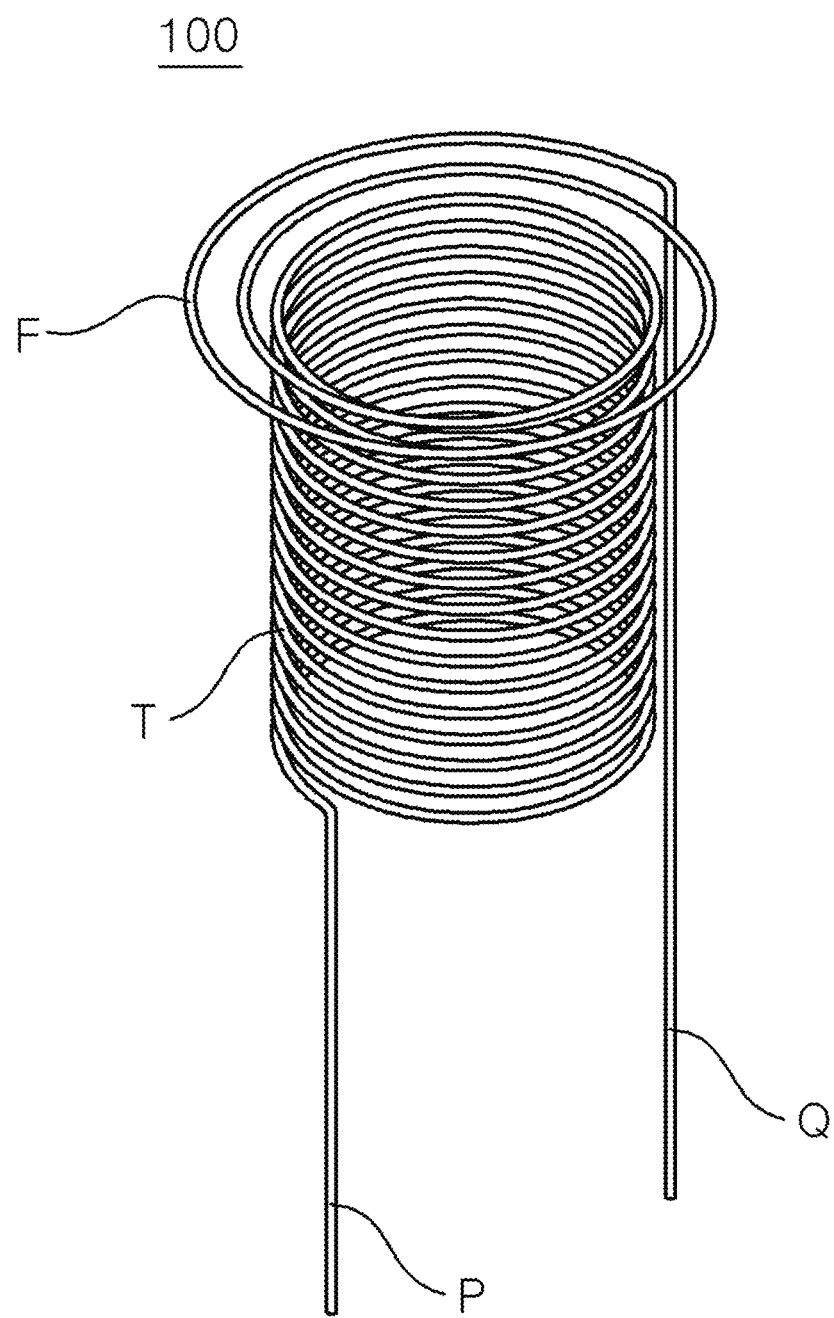
FIG. 1 is a view illustrating a heating wire of a heater for a thermal evaporator according to an embodiment of the present disclosure.

It is revealed that the accompanying drawings are exemplified as a reference for understanding the technical spirit of the present disclosure, and the scope of the present disclosure is not limited thereto.

DETAILED DESCRIPTION OF EXEMPLARY EMBODIMENTS

In the description of the present disclosure, when it is determined that widely known related functions are obvious to those skilled in the art and thus may make the subject matter of the present disclosure unclear, the detailed description will be omitted.

Terms used in the present application are used only to describe specific embodiments and are not intended to limit the present disclosure. Singular expressions include plural expressions unless clearly otherwise indicated in the context. It should be understood in the present application that terms such as "include" or "have" are intended to indicate that there are features, numbers, steps, operations, components, parts, or combinations thereof that are described in the specification and do not exclude in advance the possibility of the presence or addition of one or more other features, numbers, steps, operations, components, parts, or combinations thereof.

Hereinafter, embodiments of a heater for a thermal evaporator according to the present disclosure will be described in detail with reference to the accompanying drawings, and in description with reference to the accompanying drawings, the same or corresponding components are designated by the same reference numerals, and a duplicate description thereof will be omitted.

Figure 2:
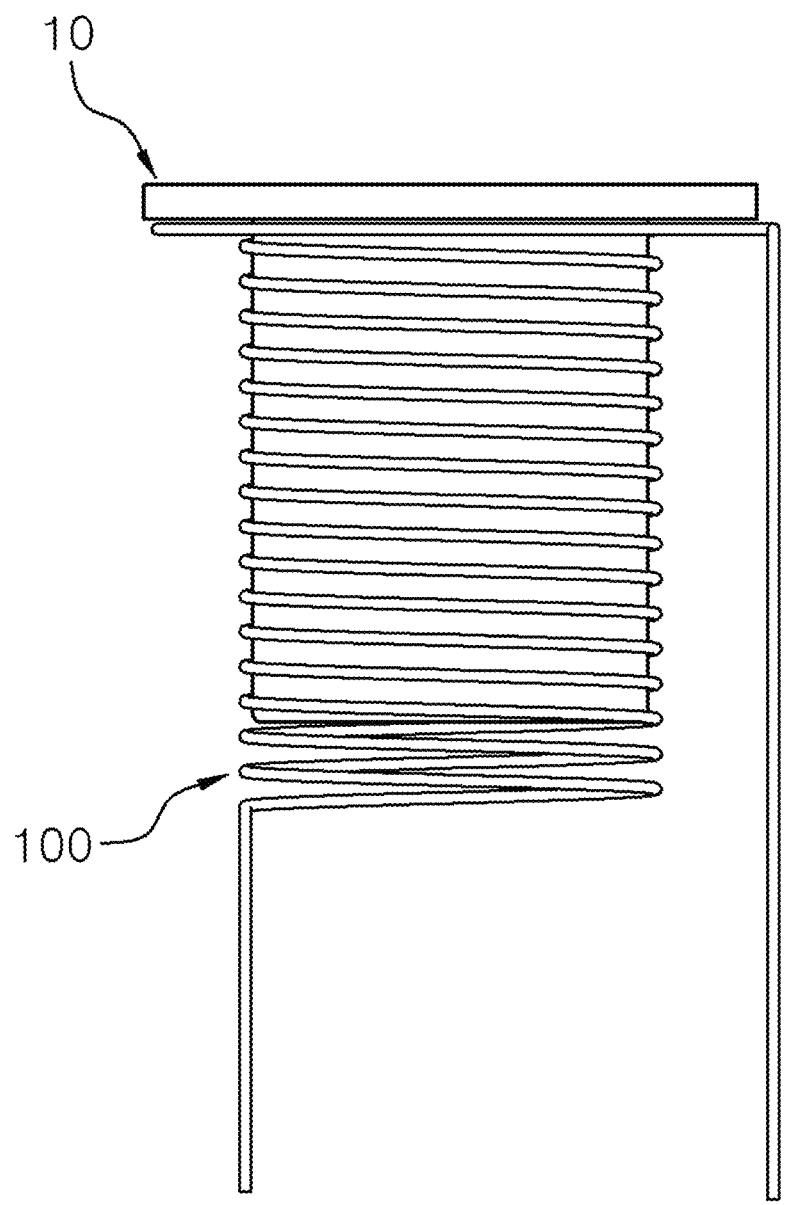
FIG. 2 is a view illustrating a state in which a crucible is inserted into the heater for a thermal evaporator according to an embodiment of the present disclosure.
Figure 3:
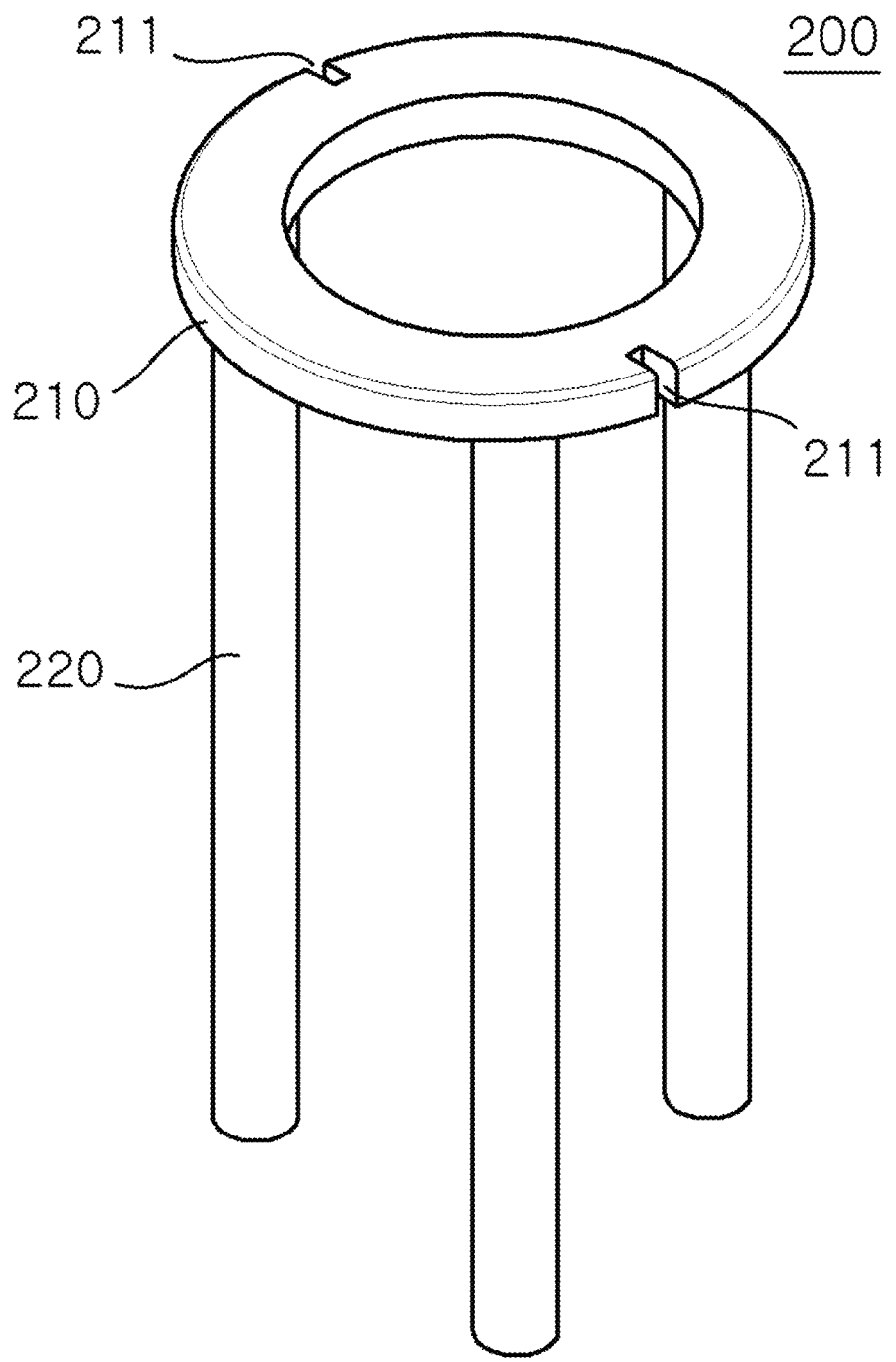
FIG. 3 is a view illustrating a support of the heater for a thermal evaporator according to an embodiment of the present disclosure.
Figure 4:
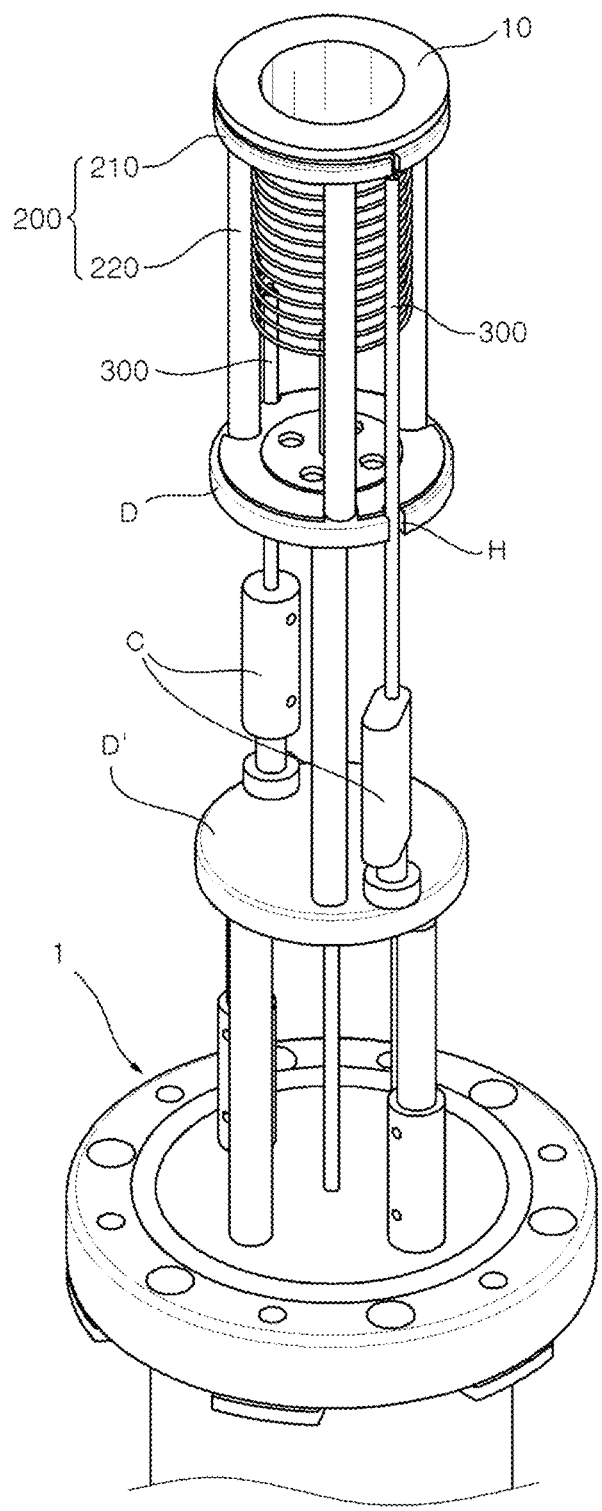
FIG. 4 is a view illustrating a state in which the heater for a thermal evaporator is installed in a disk according to an embodiment of the present disclosure.
Figure 5:
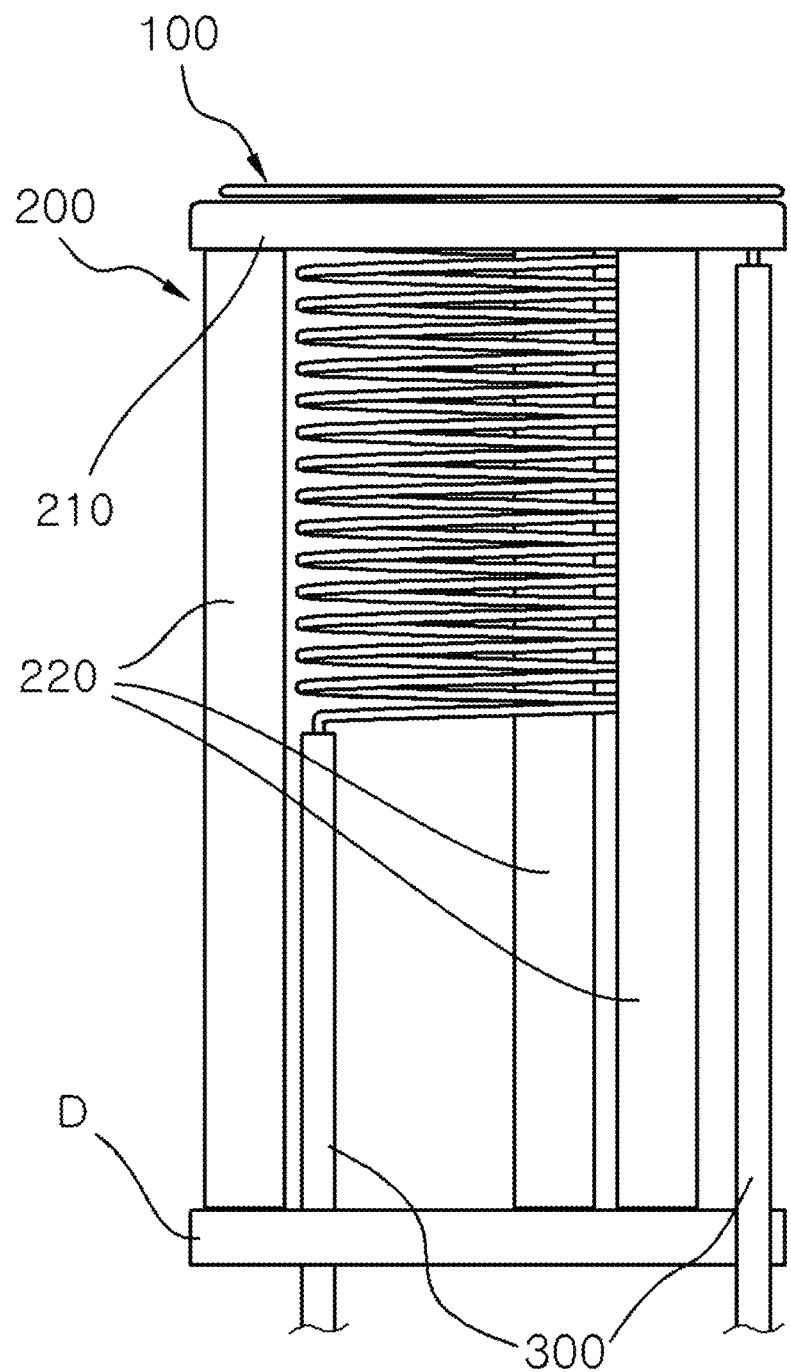
FIG. 5 is a view illustrating a state in which a heating wire and the support of the heater for a thermal evaporator are coupled to each other according to an embodiment of the present disclosure.

FIG. 1 is a view illustrating a heating wire of a heater for a thermal evaporator according to an embodiment of the present disclosure. FIG. 2 is a view illustrating a state in which a crucible is inserted into the heater for a thermal evaporator according to an embodiment of the present disclosure. FIG. 3 is a view illustrating a support of the heater for a thermal evaporator according to an embodiment of the present disclosure. FIG. 4 is a view illustrating a state in which the heater for a thermal evaporator is installed in a disk according to an embodiment of the present disclosure. FIG. 5 is a view illustrating a state in which a heating wire and the support of the heater for a thermal evaporator are coupled to each other according to an embodiment of the present disclosure.

Referring to FIGS. 1 to 5, the heater for a thermal evaporator according to the embodiment of the present disclosure may include a heating wire 100 and a support 200. The heating wire 100 may supply heat to a crucible 10, and the support 200 may support the heating wire 100 to prevent sagging of the heating wire 100.

The heater including the heating wire 100 and the support 200 corresponds to one component of the thermal evaporator. The thermal evaporator may include a vacuum chamber, a substrate loaded into the vacuum chamber, and an organic thin film formed on the substrate. Further, the thermal evaporator may further include a mask for forming a pattern on the substrate, a film thickness monitoring unit that monitors the degree of film formation on the substrate, and a film thickness controller that receives a signal from the film thickness monitoring unit to feed film thickness information back to a power supply unit.

Referring to FIGS. 1 and 2, the heating wire 100 may be formed of a linear metal and generate heat according to the supply of a current. The heating wire 100 may be formed of one strand of a linear metal. The heating wire 100 may supply heat to the container 10 (also referred to as a crucible) to heat the container 10 and thus evaporate an organic material accommodated inside the container 10. The heating wire 100 may be coiled in a cylindrical shape to surround the support the container 10. The heating wire 100 may be formed of a material having excellent thermal stability and efficiency, for example, tantalum or tungsten.

The container 10 may have an accommodation space so that the organic material may be accommodated therein. A material suitable for the required film formation may be selected as the organic material. The organic material may be a solid (generally powder). The container 10 may be transparent. The container 10 may have a flange extending outward from an upper end thereof. The flange may be supported by the heating wire 100. The container 10 may be made of ceramics that is an insulator material.

The heating wire 100 may include a tunnel part T, a flange part F, a first straight part P, and a second straight part Q. The tunnel part T, the flange part F, the first straight part P, and the second straight part Q may be connected to each other through the one strand of the linear metal.

The tunnel part T may be a part surrounding a body of the container 10 and may be coiled in a cylindrical shape. The tunnel part T may surround an outer surface of the container 10 and may be in contact with the outer surface of the container 10. The length of the tunnel part T may be greater than the length of the container 10.

The flange part F may be connected to an upper end of the tunnel part T and may be formed in a spiral shape in which a radius gradually increases in a plane direction.

The flange part F may be formed perpendicular to the tunnel part T. The tunnel part T and the flange part F may have a T shape. The tunnel part T may extend in a Z axis, and the flange part F may be placed on an XY plane. The tunnel part T may extend in a Z-axis direction while being coiled, and the flange part F may extend outward on the XY plane without extension on the Z axis. According to the flange part F extending on the XY plane, the heating wire 100 is easily supported by the support 200.

The first straight part P and the second straight part Q extend downward in a straight line. The first straight part P extends downward from a lower end (a lower distal end) of the tunnel part T. The second straight part Q extends downward from a distal end of the flange part F.

The heating wire 100 may be formed using the one strand of the linear metal connecting the first straight part P, the tunnel part T, the flange part F, and the second straight part Q.

Referring to FIG. 3, the support 200 may support the heating wire 100 and may include a ring part 210 and a bar 220.

The heating wire 100 may be sagged, particularly, in the flange part F due to its own weight. The sagging of the heating wire 100 may cause a short circuit (short), and insufficient heat may be generated in a portion in which the short circuit occurs. Furthermore, since a phenomenon in which the upper end is clogged is induced, the uniformity and coverage of a deposited thin film may be significantly reduced, and thus the reliability of the deposited thin film may be reduced. The support 200 may support the heating wire 100 to prevent the sagging of the heating wire 100.

The ring part 210 may support a lower surface of the flange part F of the heating wire 100. The ring part 210 may be formed in a circular ring. An upper surface of the ring part 210 may be formed to be flat, and thus a contact area thereof with a lower surface of the flange part F may increase. The width of the ring part 210 may be greater than the width of the flange part F of the heating wire 100. In this case, the ring part 210 may more stably support the flange part F.

The bar 220 may extend downward from the ring part 210 and may be provided as a plurality of bars 220. The bar 220 may be formed in a cylindrical shape, but the present disclosure is not limited thereto. As illustrated in FIG. 3, three bars 220 may be formed, and the bars 220 may be arranged on the ring part 210 at intervals of 120°.

A groove 211 through which the first straight part P and/or the second straight part Q may pass may be formed in an outer side of the ring part 210. The groove 211 for the first straight part P and the groove 211 for the second straight part Q may be formed. The groove 211 may be formed to be open to the outside.

The heater (the heating wire 100 and the support 200) may be fixed onto a disk D. The disk D is a configuration that may fix a location of the heater and may be formed in a circular shape. The support 200 may be fixed to the disk D, and a lower end of the bar 220 may be fixed to the disk D. The tunnel part T of the heating wire 100 may be located above the disk D and may be spaced apart from the disk D by the support 200.

Referring to FIG. 4, the heater may be fixed to the disk D, and the first straight part P and the second straight part Q may further pass through the disk D and extend downward. An electrode part 1 may be provided below the disk D, and the first straight part P and the second straight part Q may be electrically connected to corresponding electrodes. For example, the first straight part P may be connected to a positive electrode, and the second straight part Q may be connected to a negative electrode. The first straight part P and the positive electrode may be connected to each other by a copper (Cu) coupler C, and the second straight part Q and the negative electrode may be connected to each other by the copper (Cu) coupler C. The coupler may be located on a second disk D'.

Referring to FIG. 5, the first straight part P and the second straight part Q may be surrounded by an insulator 300. The insulator 300 may be formed of a ceramic material. The insulator 300 may be formed in a cylindrical shape having a hollow portion, and the first straight part P and the second straight part Q may be fixedly inserted into the hollow portion of the insulator 300.

The cylindrical insulator 300 surrounding the first straight part P and the second straight part Q may pass through the disk D. The disk D may be provided with a hole H through which the insulator 300 may pass. The insulator 300 may extend in the lengthwise direction of the first straight part P and the second straight part Q until the insulator 300 reaches the coupler C. The insulator 300 may cover 90% or more of the straight part P and the second straight part Q.

The support 200 supports the heating wire 100. The crucible 10 is inserted into the heating wire 100, and the organic material is accommodated in the crucible 10. The flange part F of the heating wire 100 may be a spiral structure.

Meanwhile, as illustrated in FIG. 5, in the tunnel part T of the heating wire 100, a distance between coils may be constant (the same).

Figure 6:
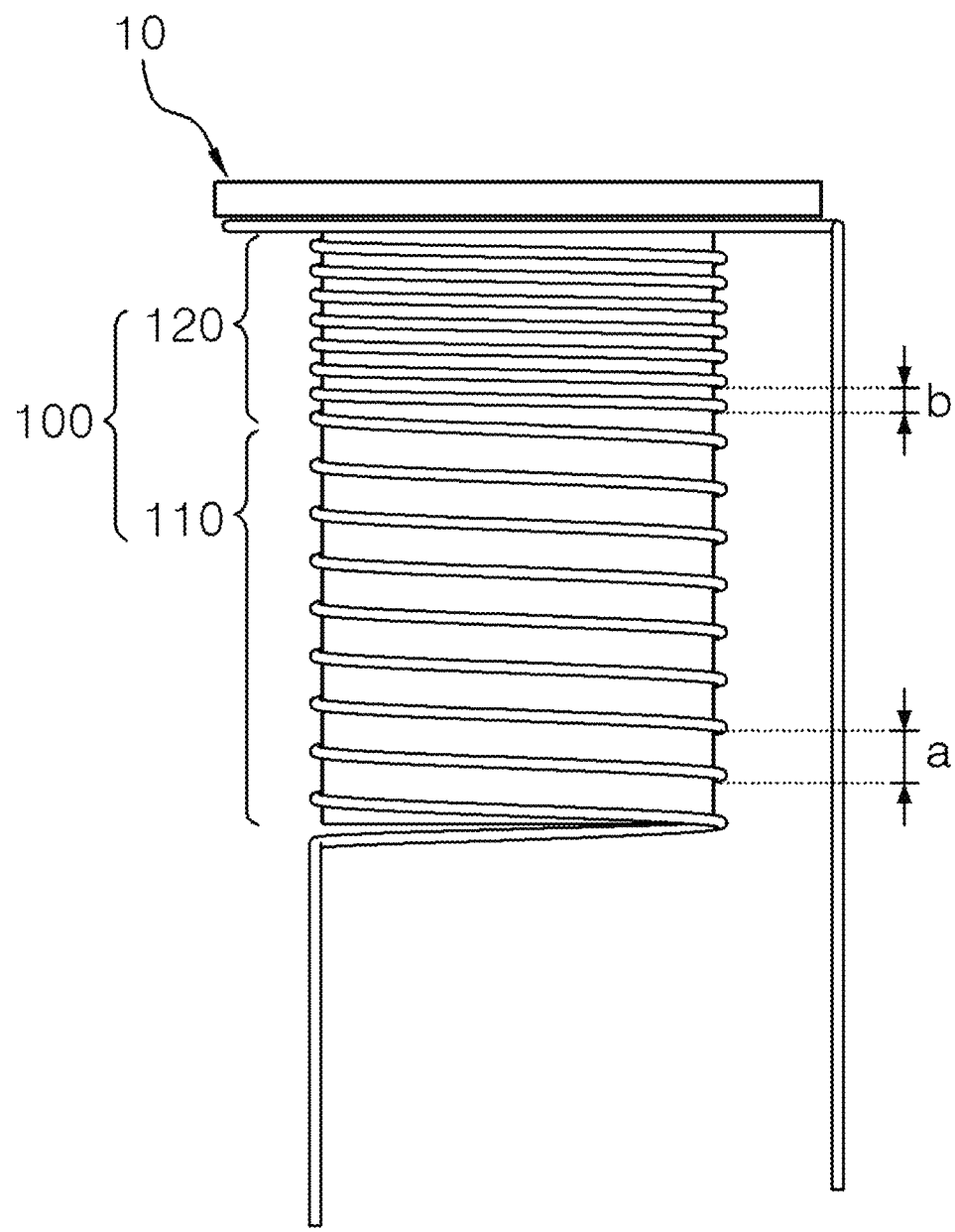
FIGS. 6 and 7 are views illustrating a heating wire of a heater for a thermal evaporator according to another embodiment of the present disclosure.
Figure 7:
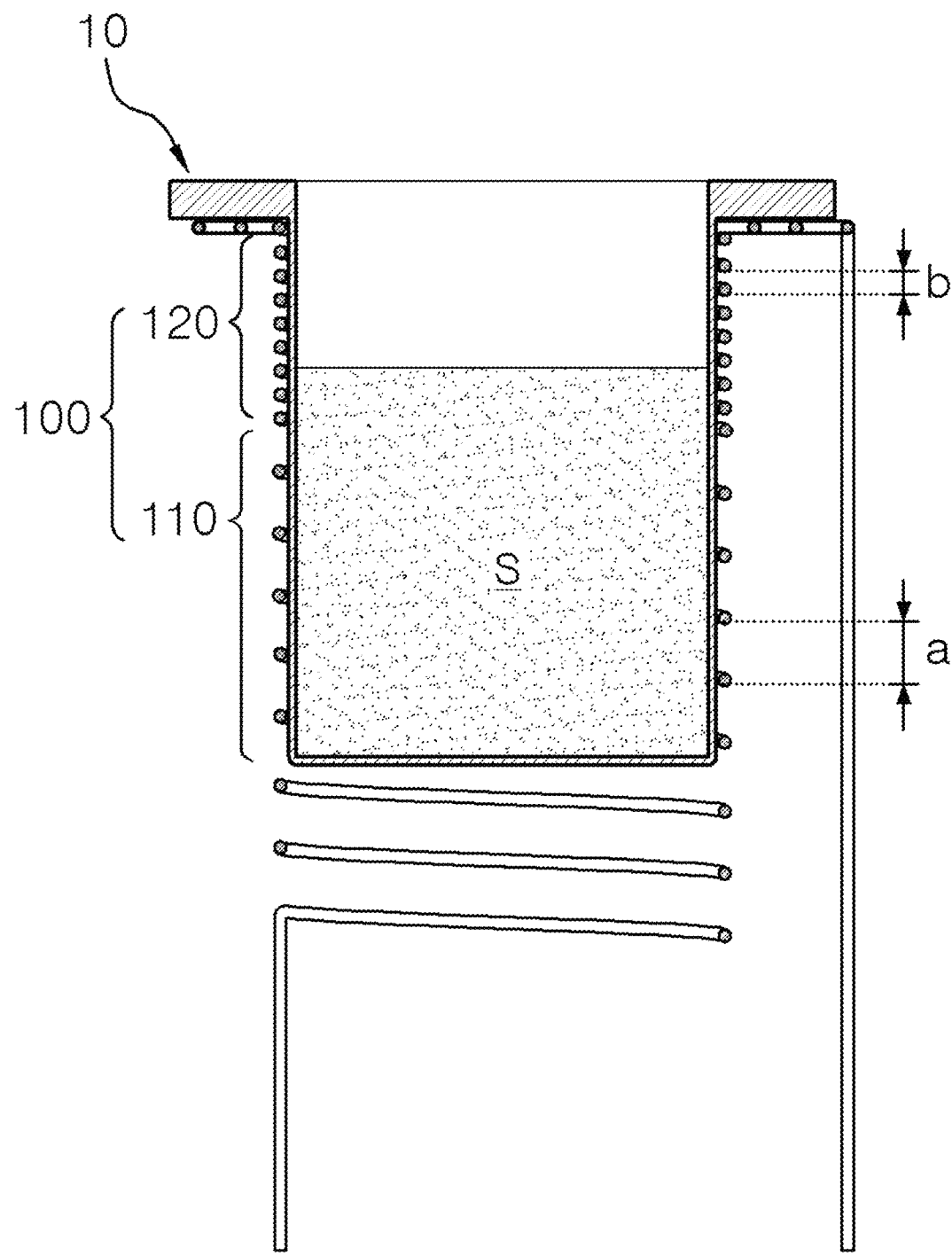

FIGS. 6 and 7 are views illustrating a heating wire of a heater for a thermal evaporator according to another embodiment of the present disclosure.

Referring to FIGS. 6 and 7, in the tunnel part T of the heating wire 100, the distance (coil pitch) between the coils may not be constant (the same). The tunnel part T may be divided into a section 110 in which a coil pitch is relatively large and a section 120 in which the coil pitch is relatively small.

In other words, the tunnel part T may be divided into the section 110 in which the number of turns of coils (per unit length) is relatively small and the section 120 in which the number of turns of coils (per unit length) is relatively large. When a filament (linear metal) is coiled with respect to a winding target having one winding axis, the coil pitch becomes narrower as the number of turns of coils becomes greater.

In particular, the tunnel part T may be provided with the section 120 thereon in which the coil pitch is small. In the tunnel part T, the section 120 may be located above the section 110. That is, the coil pitch of the upper section of the tunnel part T may be smaller than the coil pitch of the lower section of the tunnel part T.

The entire vertical length of the section 120 in which the coil pitch is small may be smaller than the entire vertical length of the section 110 in which the coil pitch is large. That is, the coil may be tightly wound on a slightly upper side of the tunnel part T. In this case, heat may be concentrated at the upper end of the tunnel part T.

Due to the characteristics of the organic material, when a general heater is used, as the organic material adjacent to the heater is evaporated first, the organic material on a side surface or at a lower end of the crucible 10 is frequently sublimated (evaporated). Accordingly, a problem that the organic material is scattered and a problem that the container (crucible) 10 is clogged may occur.

The scattering of the organic material is a phenomenon in which a solid organic material at an upper end thereof is blown away when the organic material at the lower end or on the side surface of the crucible 10 is sublimated (evaporated) first. When the organic material is scattered, the processing time and costs increase due to sample contamination, chamber contamination, and a reduced usage rate of the organic material.

A phenomenon in which the crucible 10 is clogged may occur in the case of an organic material having excellent reaction characteristics with respect to the crucible 10, and during deposition, the organic material is deposited in a form that the organic material sticks to an upper end of the crucible 10, which has a relatively low temperature, thereby causing a phenomenon in which the upper end of the crucible 10 is clogged. When the phenomenon in which the crucible 10 is clogged occurs, the uniformity and coverage of the deposited thin film are significantly reduced, thereby degrading the reliability of the deposited thin film. This greatly increases the processing time and cost due to reloading, removal of the clogging, replacement of the crucible, and the like.

In the present disclosure, temperature distribution is controlled by adjusting the coil pitch or the number of turns of coils, and accordingly, a heated portion and heat distribution of the crucible 10 may be adjusted. As a result, the scattering of the organic material or the clogging of the crucible 10 may not be induced.

That is, the upper end of the crucible 10 has a higher temperature than other portions due to the concentration of a heating element, and thus the above-described scattering of the organic material may be prevented. This is because the organic material at the upper end of the crucible 10 may be sublimated (evaporated) first as the temperature of the upper end is higher. A phenomenon in which the organic material at a lower end or a middle end of the crucible 10 is sublimated (evaporated) first before the upper end may be suppressed as much as possible.

Further, since the upper end (portion corresponding to reference numeral 120) of the crucible 10 is has a relatively higher temperature than that of a lower end (portion corresponding to reference numeral 110), a phenomenon in which a sublimated material generated during the deposition process is redeposited may be prevented, and thus the phenomenon in which an upper end of the crucible 10 is clogged may also be significantly reduced.

The temperature distribution is adjusted through adjusting the number of turns of coils, and thus the problems of the existing heater may be very effectively solved with very low cost and effort. Although there are various methods for relatively increasing the temperature of the upper end of the crucible 10, a filament-type heater according to the embodiment of the present disclosure is more meaningful in that the number of turns of one filament having the same thickness is adjusted for each location.

Referring to FIGS. 6 and 7, a pitch a of the section 110 in which the coil pitch is large is greater than a pitch b of the section 120 in which the coil pitch is small, and the section 120 in which the coil pitch is small is located on the upper side. A boundary between the section 110 in which the coil pitch is large and the section 120 in which the coil pitch is small may be located lower than a surface of the organic material S accommodated in the crucible 10, but the present disclosure is not limited thereto.

The coil pitch may be a measure for determining whether the number of windings made for the same length, that is, the number of turns of coils is large or small. When the filament is coiled with respect to the winding target having one winding axis, the coil pitch becomes narrower as the number of turns of coils becomes greater. As the coil pitch at the upper end of the crucible 10 is formed to be smaller than those of other portions, the heating element may be concentrated on the upper end of the crucible 10, and the temperature of the upper end of the crucible 10 may be formed to be relatively higher than those of other portions.

Figure 8:
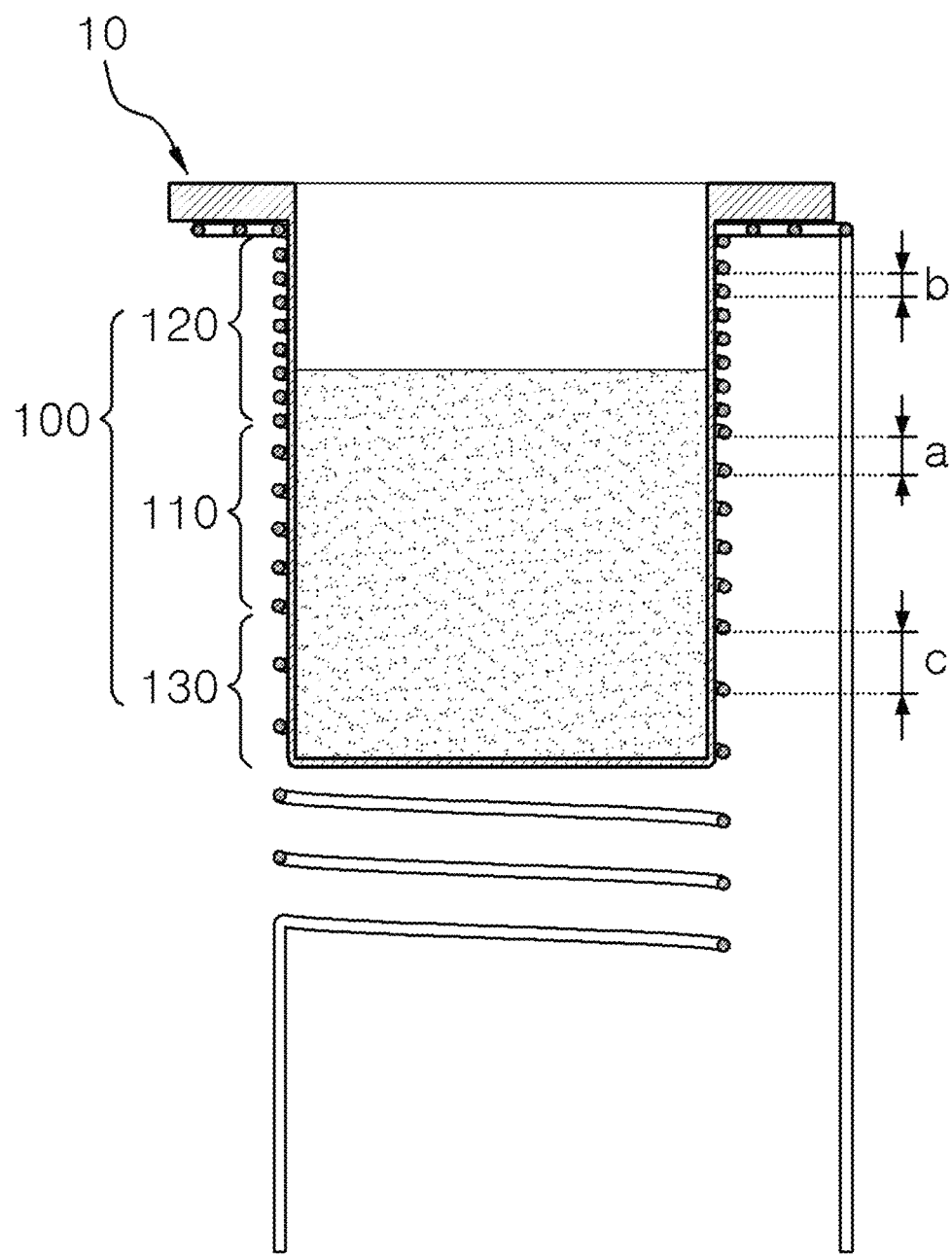
FIG. 8 is a view illustrating a heating wire of a heater for a thermal evaporator according to still another embodiment of the present disclosure.

FIG. 8 is a view illustrating a heating wire 100 of a heater for a thermal evaporator according to still another embodiment of the present disclosure.

Referring to FIG. 8, the tunnel part T may be divided into three sections. In detail, in the embodiment illustrated in FIG. 8, a section 130 in which a coil pitch is relatively larger is added to the embodiment illustrated in FIG. 7. In this case, the tunnel part T may be implemented such that the temperature distribution changes more gradually than the previous embodiments (the embodiments of FIGS. 6 and 7). In FIG. 8, the coil pitch may become smaller as it goes through the lower section 130, the middle section 110, and the upper section 120 in the order thereof (c<a<b). That is, more coils are wound from the lower end to the upper end of the tunnel part T, and thus the heating element is concentrated at the upper end of the tunnel part T.

For example, the number of turns of coils surrounding the upper section 120 is 11, the number of turns of coils surrounding the middle section 110 is 5, and the number of turns of coils surrounding the lower section 130. The number of turns of coils corresponding to the upper end, which is 11, is greater than the number of turns of coils corresponding to a middle end, which is 5, or the number of turns of coils corresponding to the lower end, which is 4, and the number of turns of coils corresponding to the middle end, which is 5, is greater than the number of turns of coils corresponding to the lower end, which is 4. That is, more coils are wound from the lower end to the upper end of the tunnel part T, and thus the heating element is concentrated at the upper end of the tunnel part T. The upper section 120 of the crucible 10 has a relatively higher temperature than other portions (middle section or lower section) due to the concentration of the heating element, and accordingly, the problem that the organic material is scattered and the problem that the upper end of the crucible 10 is clogged as described above may be prevented.

Further, the number of turns of coils just below an opening of the crucible 10 becomes larger, a support structure for serving as a support that supports the crucible 10 may also be secured more firmly. This is because, as the number of turns increases, the number of coils in contact with the crucible increases, and thus the support structure may become strong.

Since the coil pitch is affected by the number of turns of coils, the fact that the coil pitch b is smaller than the coil pitch a and/or the coil pitch c in FIGS. 7 and 8 means that the upper end has a larger number of turns of coils than those of the middle end or the lower end.

The coil pitch b of the upper section 120 is smaller than the coil pitch a of the middle section 110 or the coil pitch c of the lower section 130, and thus the number of turns of coils for the upper section 120 for the same length may be greater than those of the lower section 130 and the middle section 110.

Meanwhile, the coil pitch may become gradually smaller toward the upper side. It is illustrated in FIG. 8 that the coil pitch is constant in each of the lower section 130, the middle section 110, and the upper section 120. However, unlike this, the coil pitch in each of the lower section 130, the middle section 110, and the upper section 120 may also become smaller toward the upper side.

Thus, the upper end of the crucible 10 has a relatively higher temperature than those of other portions due to the concentration of the heating element, and accordingly, the problem that the organic material is scattered and the problem that the upper end of the crucible 10 is clogged as described above may be prevented.

The present technology can provide a heater for a thermal evaporator capable of improving a process yield by reducing problems of an existing heater at a low cost.

Further, the present technology can provide a heater for a thermal evaporator that prevents a material scattering phenomenon and a crucible clogging phenomenon regardless of the types of materials for organic material deposition.

Meanwhile, even in the case of effects not explicitly described herein, effects expected by the technical features of the present disclosure and described in the following specification and potential effects thereof are treated as those described in the specification of the present disclosure.

The protection scope of the present disclosure is not limited to the description and expression of the embodiments explicitly described above. Further, it is added once again that the protection scope of the present disclosure cannot be limited due to obvious changes or substitutions in the technical field to which the present disclosure pertains.

What is claimed is:

1. A heater for a thermal evaporator, comprising a heating wire and a support,
   wherein the heating wire includes:
   a tunnel part that surrounds an outer surface of a container in which an organic material is accommodated and is coiled in a cylindrical shape;
   a flange part that is connected to an upper end of the tunnel part and has a spiral structure in which a radius increases in a plane direction;
   a first straight part extending downward from a lower end of the tunnel part; and
   a second straight part extending downward from a distal end of the flange part, and
   the support includes:
   a ring part that supports a lower surface of the flange part; and
   a plurality of bars extending downward form the ring part.

2. The heater of claim 1, wherein the support is fixed onto a disk, and
   the tunnel part of the heating wire is located above the disk.

3. The heater of claim 2, wherein the first straight part and the second straight part further pass through the disk and extend downward, and the first straight part and the second straight part are surrounded by an insulator, and the insulator is formed to pass through the disk.

4. The heater of claim 1, wherein the support is formed of a material including ceramics.

5. The heater of claim 1, wherein the flange part is formed perpendicular to the tunnel part.

6. The heater of claim 1, wherein an upper surface of the ring part of the support is formed to be flat, and a width of the ring part of the support is greater than a width of the flange part.

7. The heater of claim 1, wherein a coil pitch of an upper side of the tunnel part is smaller than a coil pitch of a lower side thereof.

* * * * *